(12) United States Patent
Koo et al.

(10) Patent No.: US 7,671,959 B2
(45) Date of Patent: Mar. 2, 2010

(54) DISPLAY DEVICE AND MANUFACTURING METHOD THEREOF

(75) Inventors: Won Hoe Koo, Suwon-si (KR); Hoon Kim, Hwaseong-si (KR); Jung Mi Choi, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 336 days.

(21) Appl. No.: 11/753,259

(22) Filed: May 24, 2007

(65) Prior Publication Data

US 2007/0279571 A1     Dec. 6, 2007

(30) Foreign Application Priority Data

Jun. 1, 2006   (KR)   .................... 10-2006-0049549

(51) Int. Cl.
  *G02F 1/1339*   (2006.01)
  *H01J 1/62*   (2006.01)
(52) U.S. Cl. .................. 349/153; 349/190; 313/493; 313/498; 313/512
(58) Field of Classification Search ............ 349/153, 349/190; 313/493, 498, 512; 438/26
  See application file for complete search history.

(56) References Cited

U.S. PATENT DOCUMENTS

2004/0263740 A1* 12/2004 Sakakura et al. ............ 349/138

2005/0269926 A1   12/2005 Fukuoka et al.
2007/0172971 A1*  7/2007 Boroson ..................... 438/26

FOREIGN PATENT DOCUMENTS

| KR | 10-2005-0048133 | 5/2005 |
| KR | 10-2005-0067253 | 7/2005 |

* cited by examiner

Primary Examiner—Hemang Sanghavi
(74) Attorney, Agent, or Firm—H.C. Park & Associates, PLC

(57) ABSTRACT

The invention provides display devices that minimize permeation of oxygen and moisture, as well as methods of manufacturing such display devices. A display device according to the present invention includes an insulating substrate, a cover substrate connected to the insulating substrate, and a display element positioned between the insulating substrate and the cover substrate. The display device further includes a first sealant along an edge of one of the insulating substrate and the cover substrate, the first sealant including a first part and a second part spaced apart from each other, a second sealant provided along the edge of the other of the insulating substrate and the cover substrate, the second sealant being arranged between the first part of the first sealant and the second part of the first sealant, and an encapsulation film interposed between the first sealants and the second sealant.

20 Claims, 7 Drawing Sheets

DISPLAY DEVICE AND MANUFACTURING METHOD THEREOF

CROSS-REFERENCE TO RELATED APPLICATIONS

This application claims priority from and the benefit of Korean Patent Application No. 10-2006-0049549, filed on Jun. 1, 2006, which is hereby incorporated by reference for all purposes as if fully set forth herein.

BACKGROUND OF INVENTION

1. Field of the Invention

The present invention relates to a display device and a manufacturing method thereof, and more particularly, to a display device and a manufacturing method thereof, which can prevent permeation of oxygen and moisture.

2. Discussion of the Background

Recently, organic light emitting diode (OLED) devices have attracted attention and interest in the industry of flat panel display devices because of their low-power requirements, light weight, slim shape, wide viewing angle, and high-speed response. An OLED device includes a plurality of thin film transistors and pixel electrodes. Each thin film transistor may include a gate electrode, a source electrode, and a drain electrode and each pixel electrode is connected to a thin film transistor. Walls disposed between the pixel electrodes partition the pixel electrodes. Each pixel electrode has a light emitting layer formed thereon and each light emitting layer has a common electrode formed thereon. The light emitting layer is a self-light-emitting element that may be made of an organic material. As the efficiency and durability of the light emitting layer are easily affected by oxygen and moisture, the light emitting layer may easily be deteriorated by oxygen and moisture from the outside. Thus, an insulating substrate including an organic light emitting layer is connected to a cover substrate that prevents the infiltration of oxygen and moisture. An encapsulation resin, such as a sealant, is interposed between the insulating substrate and the cover substrate to couple the substrates and to prevent oxygen and moisture from infiltrating the organic light emitting layer.

However, encapsulation resins may include material having relatively high moisture and oxygen permeabilities. Thus, more oxygen and moisture infiltrate between the insulating substrate and the cover substrate as the distance between the substrates increases.

SUMMARY OF THE INVENTION

The present invention provides a display device that may minimize permeation of oxygen and moisture.

Further, the present invention also provides methods of manufacturing display devices that minimize permeation by oxygen and moisture.

Additional features of the invention will be set forth in the description which follows, and in part will be apparent from the description, or may be learned by practice of the invention.

The present invention discloses a display device including an insulating substrate, a cover substrate spaced a distance from and connected to the insulating substrate, and a display element positioned between the insulating substrate and the cover substrate. The display device further includes a first sealant provided along an edge of one of the insulating substrate and the cover substrate, the first sealant including a first part and a second part being spaced apart from each other, a second sealant provided along an edge of the other of the insulating substrate and the cover substrate, wherein the second sealant being arranged between first part of the first sealant and the second part of the first sealant, and an encapsulation film interposed between the first sealant and the second sealant.

The invention also discloses a display device including an insulating substrate, a cover substrate and a connecting member. The connecting member may be positioned along the edges of the insulating substrate and the cover substrate and may connect the insulating substrate and the cover substrate. The connecting member includes a first sealant disposed on the insulating substrate, the first sealant including a first part and a second part being spaced apart from each other, an encapsulation film including a substantially curved cross section disposed on the first sealant, and a second sealant disposed on the encapsulation film and in contact with the cover substrate.

The present invention further discloses a method of manufacturing a display device including forming a first sealant along an edge of one of an insulating substrate and a cover substrate, the first sealant including a first part and a second part being spaced apart from each other thereon, hardening the first sealant, forming an encapsulation film on the first sealant, forming a second sealant along an edge of the other of the insulating substrate and the cover substrate, connecting the insulating substrate and the cover substrate so that the second sealant is engaged between the first part of the first sealant and the second part of the first sealant, and hardening the second sealant.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serving to explain the principles of the invention.

DETAILED DESCRIPTION OF THE ILLUSTRATED EMBODIMENTS

Figure 1:
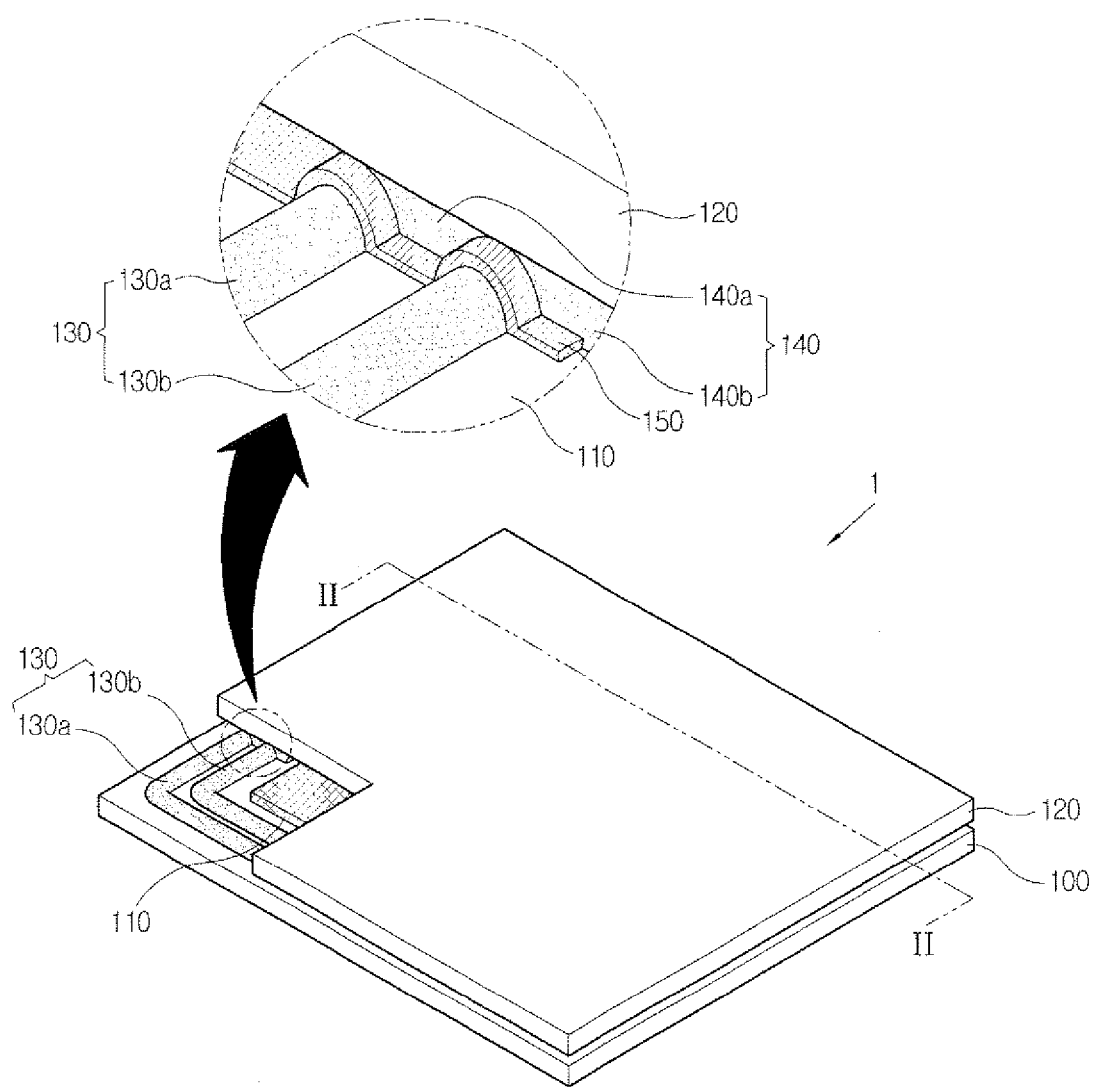
FIG. 1 shows a structure of a display device according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
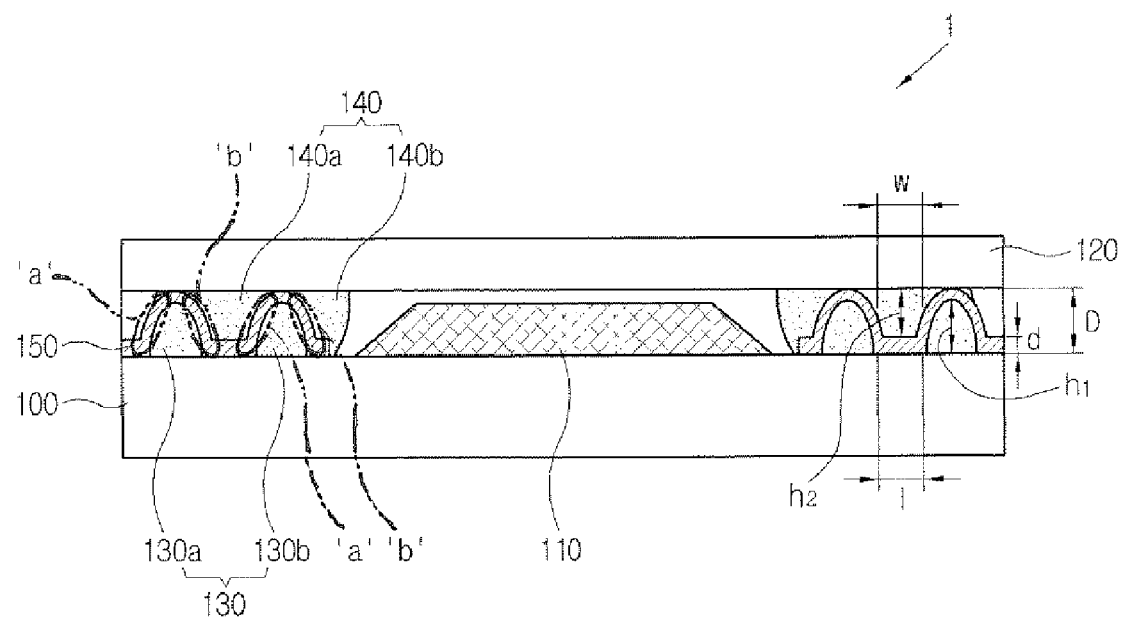
FIG. 2 is a cross-sectional view of the display device taken along line II-II of FIG. 1.

FIG. 1 illustrates a structure of a display device according to a first exemplary embodiment of the present invention; and FIG. 2 a cross-sectional view taken along line II-II in FIG. 1.

Referring to FIG. 1 and FIG. 2, an OLED 1 according to the first exemplary embodiment of the present invention includes an insulating substrate 100, a display element 110 to display an image, and a cover substrate 120. The cover substrate and the insulating substrate 100 prevent oxygen and moisture from infiltrating the display element 110. The OLED 1 further includes a connecting member formed along edges of the insulating substrate 100 and the cover substrate 120 and connecting the insulating substrate 100 to the cover substrate 120. The connecting member includes a first sealant 130 provided along the edges of the insulating substrate 100, a second sealant 140 provided along the edges of the cover substrate 120, and an encapsulation film 150 interposed between the first sealant 130 and the second sealant 140.

The insulating substrate 100 may be provided as a transparent substrate such as a glass substrate or a plastic substrate. A blocking layer (not shown) may further be formed on the insulating substrate 100, i.e., between the display element 110 and the insulating substrate 100. The blocking layer blocks oxygen or moisture from infiltrating into the display element 110 through the insulating substrate 100. The blocking layer may be made of SiON, $SiO_2$, $SiN_x$, $Al_2O_3$ or the like and may be formed by sputtering or the like.

The display element 110 may include a plurality of thin film transistors and pixel electrodes. Each thin film transistor may have a gate electrode, a source electrode, and a drain electrode, and each pixel electrode may be connected to a thin film transistor. Walls may be formed between the pixel electrodes to divide them from one another. An organic light emitting layer may be formed on each pixel electrode and a common electrode may be formed on each organic light emitting layer. The display element 110 may display an image corresponding to an image signal which is input from a data processing device.

The cover substrate 120 may include the same material as the insulating substrate 100. For example, the cover substrate 120 may include a soda-lime glass substrate, a boro-silicate glass substrate, a silicate glass substrate, a lead glass substrate, or any other suitable material. In order to sufficiently prevent oxygen or moisture from infiltrating the display element 110 through the cover substrate 120, the cover substrate 120 may be about 0.1 mm to about 10 mm thick. The cover substrate 120 may preferably be in the range of about 1 mm to about 10 mm.

The first sealant 130 and the second sealant 140 are formed along the edges of the insulating substrate 100 and the cover substrate 120, respectively. The first and second sealants 130 and 140 are provided as sealing resins such as polyepoxy series and ployacryl series and act to prevent oxygen and moisture from infiltrating the display element 110 through the space between the insulating substrate 100 and the cover substrate 120. The first sealant 130 may include two or more parts, for example, a first part 130a and a second part 130b, provided along the edge of the insulating substrate 100 and spaced from each other at a predetermined interval. The second sealant 140 may include a first part 140a provided between the first part of the first sealant 130a and the second part of the first sealant 130b along the edge of the cover substrate 120. The first sealant 140 and the second sealant 140 may comprise the same material.

In detail, referring to FIG. 2, the first part of the first sealant 130a and the second part of the first sealant 130b are formed along the outer edge of the insulating substrate 100 and are spaced apart from each other at a predetermined interval such that the second part of the first sealant 130b is disposed inward from the first part of the first sealant 130a. The first part of the first sealant 130a and the second part of the first sealant 130b include contact surfaces, which are curved, rather than angular. If the parts of the first sealant 130a and 130b had angular contact surfaces, an open area could be formed in the encapsulation film 150 when the encapsulation film 150 is formed on the first part of the first sealant 130a and the second part of the first sealant 130b. This open area may be minimized when the contact surfaces of the first sealant are curved. Namely, it is preferred to form the first part of the first sealant 130a and the second part of the first sealant 130b such that they have curved contact surfaces in order to form the encapsulation film 150 uniformly. As shown in FIG. 2, the cross sections of the first part of the first sealant 130a and the second part of the first sealant 130b each have a nearly half circular shape.

The second sealant may include one or more parts. For example, FIG. 2 shows an exemplary embodiment wherein the second sealant includes a first part 140a and a second part 140b. The first part of the second sealant 140a is formed between the first part of the first sealant 130a and the second part of the first sealant 130b along the edge of the cover substrate 120 and is spaced apart from the second part of the second sealant 140b at a predetermined interval. The second part of the second sealant 140b is disposed inward from the first part of the second sealant 140a. The second part of the first sealant 130b is disposed between the first part of the second sealant 140a and the second part of the second sealant 140b. That is, the parts of the second sealant 140a, 140b are alternately provided with respect to the parts of the first sealants 130a, 130b.

The heights (h1) and (h2) of the first sealant 130 and the second sealant 140 are substantially the same and the distance (1) between the first part of the first sealant 130a and the second part of the first sealant 130b is substantially the same as the width (w) of the first part of the second sealant 140a. The height (h1) of the first sealant 130 refers to the distance between the surface of the insulating substrate 100 and the top of the first sealant 130, and the height (h2) of the second sealant 140 refers to the distance between the surface of the cover substrate 120 and the top of the second sealant 140. The distance (1) between the first part of the first sealant 130a and the second part of the first sealant 130b refers to the distance between the first part of the first sealant 130a and the second part of the first sealant 130b along the insulating substrate 100 and the width (w) of the first part of the second sealant 140a or the second part of the second sealant 140b is the width of the first part of the second sealant 140a or the second part of the second sealant 140b along the cover substrate 120.

The encapsulation film 150 is interposed between the first sealant 130 and the second sealant 140. The encapsulation film 150 may be formed along the edges of the insulating substrate 100 and the cover substrate 120. A portion of the encapsulation film 150 may partially overlap with at least one of the insulating substrate 100 and the cover substrate 120. A cross section of the encapsulation film 150 may form a substantially curved pattern which includes a first section (a) extending toward the cover substrate 120 from the insulating substrate 100 and a second section (b) extending toward the insulating substrate 100 from the cover substrate 120. Opposite ends of the first section (a) and the second section (b) may be in contact with the insulating substrate 100 and the cover substrate 120. Referring to FIG. 2, a plurality of first sections (a) and second sections (b) are alternately disposed. The encapsulation film 150 may include a plurality of layers and may also include an inorganic material. For example, the encapsulation film 150 may include $SiO_x$, $SiN_x$, $SiON_x$, $AlO_x$, $AlON_x$, and/or $AlN_x$. Encapsulation films including inorganic material tend to have low moisture and oxygen permeabilities, and therefore, effectively protect the organic light emitting layer.

The distance (D) between the insulating substrate 100 and the cover substrate 120 is substantially the same as the sum of the thickness (d) of the encapsulation film 150 and one of the heights (h1) and (h2) of the first sealant 130 and the second sealant 140. The distance (D) between the insulating substrate 100 and the cover substrate 120 is less than that of conventional display devices, and therefore, reduces the amount of oxygen and moisture that may infiltrate between the insulating substrate and the cover substrate. For example, referring to FIG. 2, oxygen and moisture infiltrating between the insulating substrate 100 and the cover substrate 120 would have to pass through the encapsulation film 150, the first part of the first sealant 130a, the encapsulation film 150, the second part of the second sealant 140a, the encapsulation film 150, the second part of the first sealant 130b, the encapsulation film 150, and the second part of the second sealant 140b to reach the organic light emitting layer. Thus, the amount of oxygen and moisture that may infiltrate through a lateral side of the display device may be minimized. Accordingly, the display device of the present invention may have improved efficiency and durability.

Hereinafter, a method of manufacturing a display device according to the first exemplary embodiment of the present invention will be described with reference to FIG. 3A, FIG. 3B, FIG. 3C, and FIG. 3D.

Figure 3A:
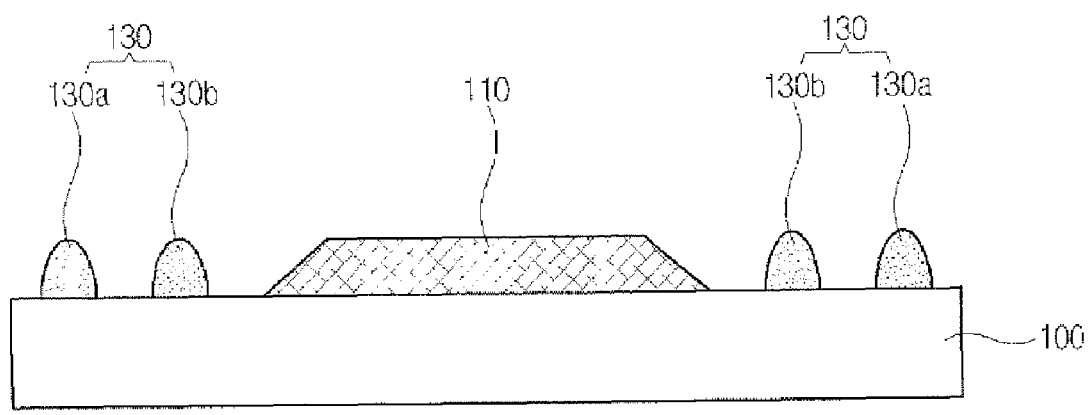
FIG. 3A, FIG. 3B, FIG. 3C, and FIG. 3D show a method of manufacturing the display device according to the first exemplary embodiment of the present invention.

Referring to FIG. 3A, the first sealant 130 is formed along the edge of the insulating substrate 100. The first sealant 130 includes a first part 130a and a second part 130b, which are spaced apart from each other at a predetermined interval. The first part of the first sealant 130a is formed along the outer edge of the insulating substrate 100, and the second part of the first sealant 130b is disposed inward from the first part of the first sealant 130a. The first sealant 130 may be formed by a screen printing method using a mask with a predetermined pattern or by a dispensing method. The first sealant 130 may be formed such that the first part 130a and the second part 130b have curved contact surfaces due to fluidity of the viscous sealant resin. After the first sealant 130 is formed, it may be hardened by at least one of light and heat.

Figure 3B:
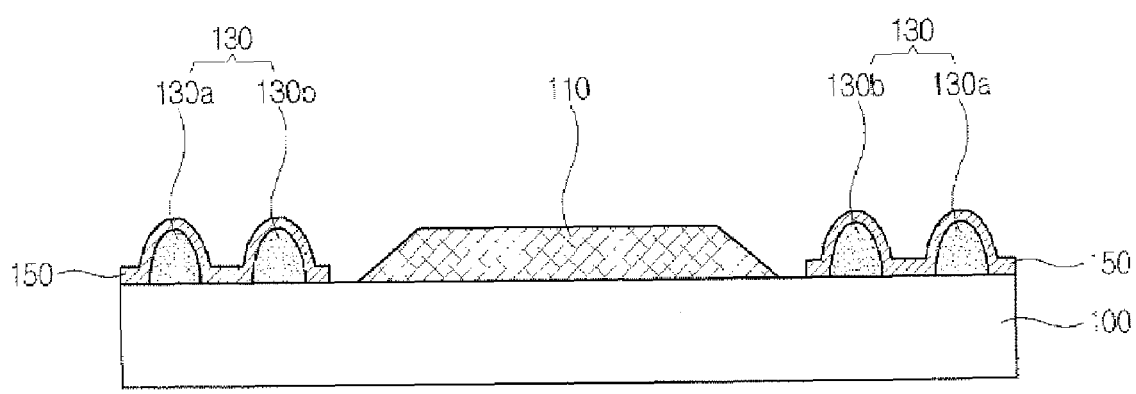
Figure 3C:
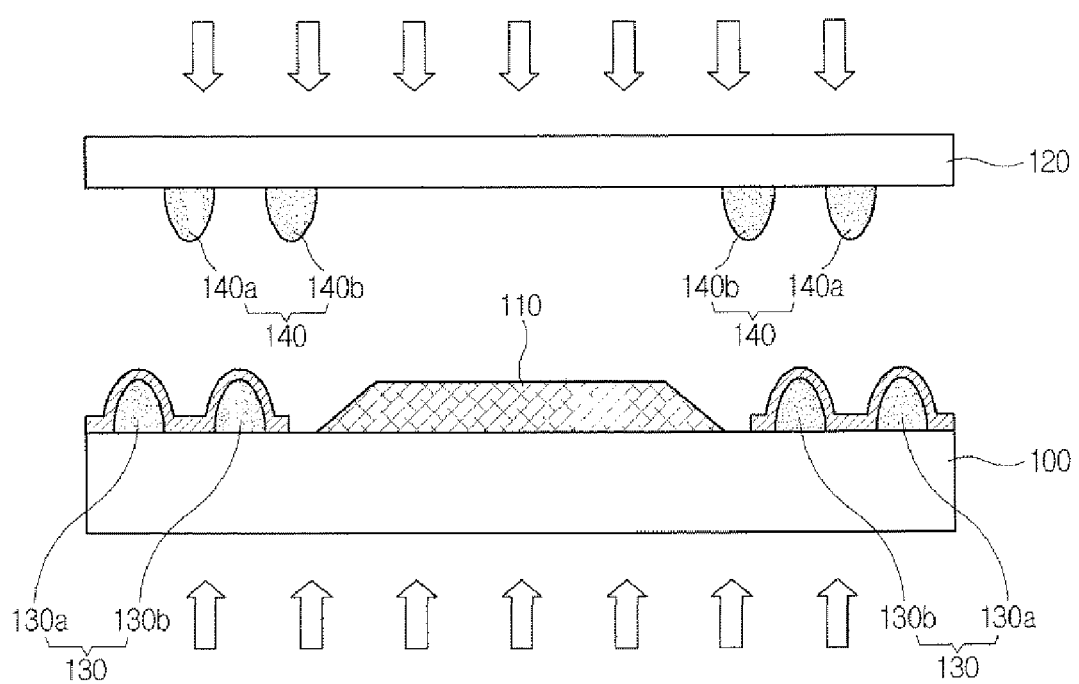

Referring to FIG. 3B, the encapsulation film 150 is formed on the first sealant 130. The encapsulation film 150 may include a plurality of layers and may also include an inorganic material such as a nitride or the like. For example, the encapsulation film 150 may include $SiO_x$, $SiN_x$, $SiON_x$, $AlO_x$, $AlN_x$ and/or $AlN_x$. The encapsulation film 150 may be formed by a sputtering method, an ion beam assisted deposition method, an ion beam sputtering method, a plasma enhanced chemical vapor deposition method, a thermal evaporation method, or an e-beam evaporation method. The ion beam assisted deposition method, the ion beam sputtering method and the sputtering method all may form a dense thin film with high energy. However, these methods may damage the display element 110, and thus, are preferably used in forming the encapsulation film 150 along the edge of the insulating substrate 100 and away from the display element 110. Encapsulation films including inorganic material tend to have low oxygen and moisture transmittances, and therefore, effectively protect the organic light emitting layer. Referring to FIG. 3C, the first part of the second sealant 140a and the second part of the second sealant 140b are formed along the edge of the cover substrate 120 in the same manner that the first part of the first sealant 130a and the second part of the first sealant 130b are formed along the edge of the insulating substrate 100. The first part of the second sealant 140a is formed between the first part of the first sealant 130a and the second part of the first sealant 130b along the edge of the cover substrate 120. The second part of the second sealant 140b is spaced apart from first part of the second sealant 140a at a predetermined interval and disposed inward from the first part of the second sealant 140a. The first part of the second sealant 140a and the second part of the second sealant 140b may be formed by the screen printing method or the dispensing method as with the first sealant 130. With the screen printing method, the first part of the second sealant 140a and the second part of the second sealant 140b may be formed by the same mask used for the first sealants 130. The second sealant 140 is not yet hardened at this point.

Referring to FIG. 3C, when the first sealant 130 and the second sealant 140 are provided on the insulating substrate 100 and the cover substrate 120, respectively, the insulating substrate 100 and the cover substrate 120 are arranged so that the first part of the second sealant 140a is disposed between the first part of the first sealant 130a and the second part of the first sealant 130b. That is, the first part of the first sealant 130a and the second part of the first sealant 130b are disposed alternately with respect to the first part of the second sealant 140a and the second part of the second sealant 140b.

Figure 3D:
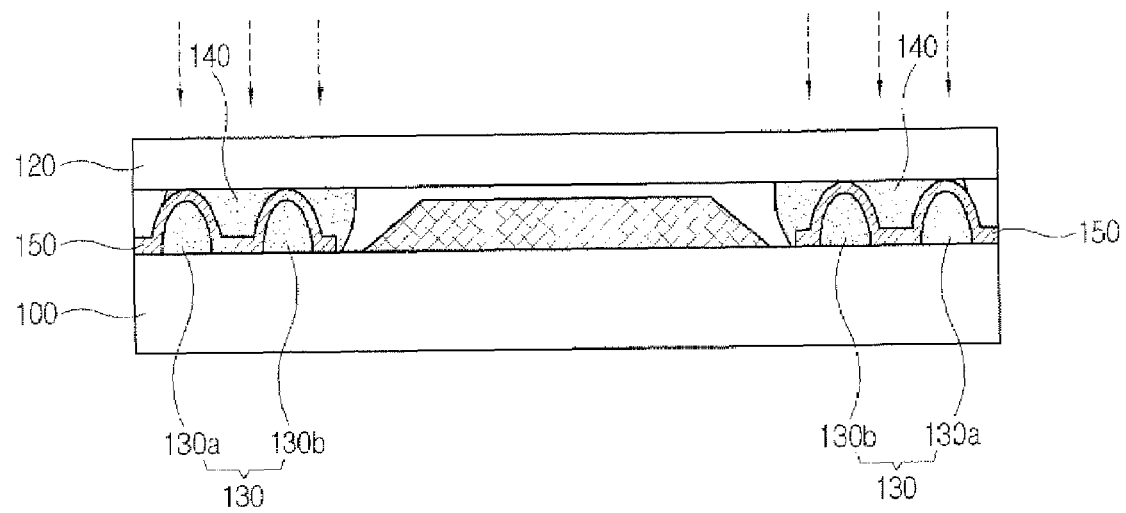

Referring to FIG. 3D, the substrates 100 and 120 are coupled together. Then the second sealant 140 is hardened by at least one of heat and/or light to adhere the substrates 100 and 120 to each other.

As described above, the first part of the first sealant 130a and the second part of the first sealant 130b are disposed alternately with respect to the first part of the second sealant 140a, and the second part of the second sealant 140b and thus, the interval between the insulating substrate 100 and the cover substrate 120 may decrease, providing for a thinner display. Accordingly, the amount of oxygen and moisture infiltrating between the insulating substrate 100 and the cover substrate 120 may decrease. In particular, oxygen and moisture infiltrating between the insulating substrate 100 and the cover substrate 120 would have to pass through the encapsulation film 150, the first part of the first sealant 130a, the encapsulation film 150, the first part of the second sealant 140a, the encapsulation film 150, second part of the first sealant 130b, the encapsulation film 150, and the second part of the second sealant 140b to reach the organic light emitting layer. Therefore, the amount of oxygen and moisture which may infiltrate through a lateral side of the display device may be minimized. Accordingly, the display device of the present invention may have improved performance and durability.

A display device and a manufacturing method thereof according to a second exemplary embodiment of the present invention will be described below with reference to FIG. 4. It should be noted that the following description will be made to only different features from those of the first exemplary embodiment.

Figure 4:
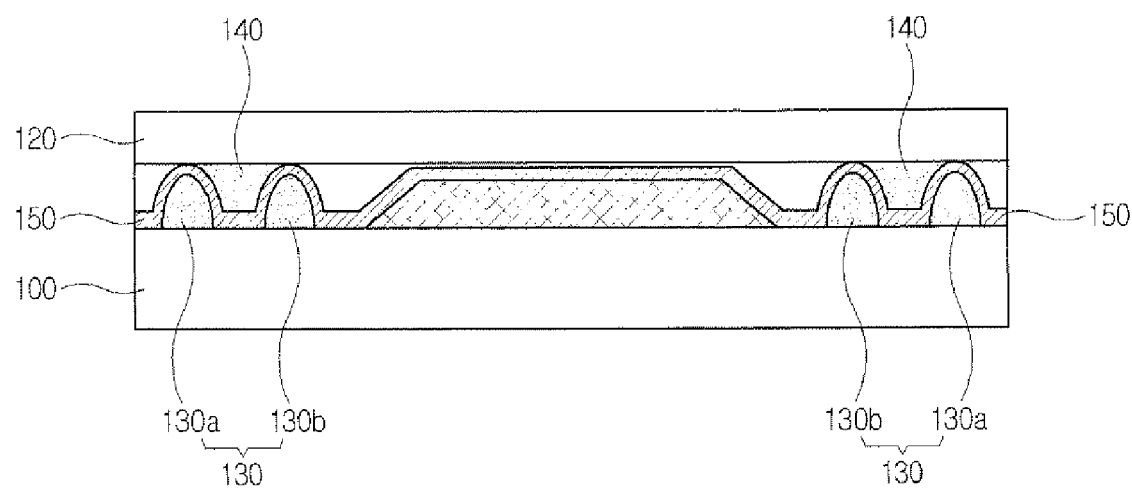
FIG. 4 shows a structure of a display device according to a second exemplary embodiment of the present invention.

Referring to FIG. 4, an encapsulation film 150 covers a display element 110, and a second sealant 140 is provided between a first part of a first sealant 130a and a second part of a first sealant 130b. In other words, a second sealant 140 having at least one part and a first sealant 130 having at least two parts may be provided. Since oxygen and moisture infiltrating through a lateral side of the display device will have to pass through more layers of the first sealant 130, the second sealant 140, and the encapsulation film 150 to reach the display element as the number of parts of the first sealant 130 and the second sealant 140 increases, the amount of oxygen and moisture that may infiltrate through a lateral side of the display device may be minimized. When the encapsulation film 150 covers the display element 110, the encapsulation film 150 is preferably formed by the thermal evaporation method or the e-beam evaporation method because deposition methods using plasma, such as the ion beam assisted deposition method, the ion beam sputtering method, and the sputtering method, may damage the display element 110, as described above in the first exemplary embodiment.

In another exemplary embodiment, the first sealant 130 may be provided on a cover substrate 120, and the second sealant 140 may be provided on an insulating substrate 100.

As described above, according to exemplary embodiments of the present invention, it may be possible to provide a display device that minimizes permeation by oxygen and moisture.

Further, it may be possible to provide a method of manufacturing display devices that minimizes permeation of oxygen and moisture.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
    an insulating substrate;
    a cover substrate connected to the insulating substrate;
    a display element between the insulating substrate and the cover substrate;
    a first sealant provided along an edge of one of the insulating substrate and the cover substrate, the first sealant comprising a first part and a second part, the first part and the second part being spaced apart from each other;
    a second sealant provided along an edge of the other of the insulating substrate and the cover substrate, the second sealant being arranged between the first part of the first sealant and the second part of the first sealant; and
    an encapsulation film interposed between the first sealant and the second sealant.

2. The display device of claim 1, wherein the first sealant and the second sealant comprise contact surfaces and the encapsulation film curves between the contact surfaces of the first sealant and the contact surface of the second sealant.

3. The display device of claim 2, wherein a portion of the encapsulation film contacts at least one of the insulating substrate and the cover substrate.

4. The display device of claim 2, wherein the distance between the insulating substrate and the cover substrate is substantially the same as the sum of the thickness of the encapsulation film and the height of one of the first sealant and the second sealant.

5. The display device of claim 3, wherein the height of the first sealant and the height of the second sealant are substantially the same.

6. The display device of claim 5, wherein the distance between the first part of the first sealant and the second part of the first sealant is substantially the same as the width of the second sealant.

7. The display device of claim 1, wherein the encapsulation film comprises an inorganic material.

8. The display device of claim 7, wherein the encapsulation film comprises at least one of $SiO_x$, $SiN_x$, $SiON_x$, $AlO_x$, $AlN_x$, and $AlN_x$.

9. The display device of claim 1, wherein the encapsulation film covers the display element.

10. The display device of claim 1, wherein the first sealant comprises at least one of polyacryl series and polyepoxy series.

11. The display device of clam 1, wherein the first sealant and the second sealant comprise the same material.

12. A display device, comprising:
    an insulating substrate;
    a cover substrate; and
    a connecting member positioned along an edge of the insulating substrate and the cover substrate to connect the insulating substrate and the cover substrate, wherein the connecting member comprises:
        a first sealant disposed on the insulating substrate, the first sealant comprising a first part and a second part spaced apart from each other,
        an encapsulation film comprising a substantially curved cross section disposed on the first sealant, and
        a second sealant disposed on the encapsulation film and in contact with the cover substrate.

13. The display device of claim 12, wherein a portion of the encapsulation film contacts at least one of the insulating substrate and the cover substrate.

14. The display device of claim 13, wherein the encapsulation film comprises:
    a first section extending toward the cover substrate from the insulating substrate, and
    a second section extending toward the insulating substrate from the cover substrate, and
    a plurality of first sections and second sections are alternately disposed.

15. A method for manufacturing a display device, comprising:
    forming a first sealant along an edge of one of an insulating substrate and a cover substrate, the first sealant comprising a first part and a second part spaced apart from each other;
    hardening the first sealant;
    forming an encapsulation film on the first sealant;
    forming a second sealant along an edge of the other of the insulating substrate and the cover substrate;
    connecting the insulating substrate and the cover substrate so that the second sealant is arranged between the first part of the first sealant and the second part of the first sealant; and
    hardening the second sealant.

16. The method of claim 15, wherein the first sealant and the second sealant are formed by a screen printing method or a dispensing method.

17. The method of claim 16, wherein the first sealant and the second sealant comprise contact surfaces and the encapsulation film curves between the contact surfaces of the first sealant and the contact surface of the second sealant.

18. The method of claim 17, wherein the first sealant and the second sealant are hardened by heat or light.

19. The method of claim 17, wherein the encapsulation film is formed by one of a sputtering method, an ion beam assisted deposition method, an ion beam sputtering method, a plasma enhanced chemical vapor deposition method, a thermal evaporation method, and an e-beam evaporation method.

20. The method of claim 19, wherein the encapsulation film covers a display element arranged between the insulating substrate and the cover substrate.

* * * * *